(12) United States Patent
Yu et al.

(10) Patent No.: US 9,728,544 B2
(45) Date of Patent: Aug. 8, 2017

(54) SEMICONDUCTOR DEVICE AND METHOD OF MANUFACTURING THE SAME

(71) Applicant: Samsung Electronics Co., Ltd., Suwon-si, Gyeonggi-do (KR)

(72) Inventors: Tea Kwang Yu, Hwaseong-si (KR); Yong Tae Kim, Yongin-si (KR); Jae Hyun Park, Seoul (KR); Kyong Sik Yeom, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 10 days.

(21) Appl. No.: 14/919,083

(22) Filed: Oct. 21, 2015

(65) Prior Publication Data
US 2016/0148944 A1    May 26, 2016

(30) Foreign Application Priority Data

Nov. 26, 2014 (KR) .................. 10-2014-0166698

(51) Int. Cl.
| | |
|---|---|
| *H01L 27/11* | (2006.01) |
| *H01L 27/11536* | (2017.01) |
| *H01L 29/423* | (2006.01) |
| *H01L 29/788* | (2006.01) |
| *H01L 27/11521* | (2017.01) |

(52) U.S. Cl.
CPC .. *H01L 27/11536* (2013.01); *H01L 27/11521* (2013.01); *H01L 29/42328* (2013.01); *H01L 29/7881* (2013.01)

(58) Field of Classification Search
CPC ......... H01L 27/11521; H01L 27/11536; H01L 29/42328; H01L 29/7881
See application file for complete search history.

(56) References Cited

U.S. PATENT DOCUMENTS

| | | | |
|---|---|---|---|
| 6,372,608 B1 | 4/2002 | Shimoda et al. | |
| 6,420,232 B1 * | 7/2002 | Wu ................... | H01L 27/11526 257/298 |
| 6,645,830 B2 | 11/2003 | Shimoda et al. | |
| RE38,466 E | 3/2004 | Inoue et al. | |
| 6,818,465 B2 | 11/2004 | Biwa et al. | |

(Continued)

FOREIGN PATENT DOCUMENTS

| | | |
|---|---|---|
| KR | 2007-0086471 A | 8/2007 |
| KR | 2008-0021242 A | 3/2008 |
| KR | 2009-0018444 A | 2/2009 |

*Primary Examiner* — Allan R Wilson
(74) *Attorney, Agent, or Firm* — Harness, Dickey & Pierce, P.L.C.

(57) ABSTRACT

A method of manufacturing a semiconductor device may include forming split gate structures including a floating gate electrode layer and a control gate electrode layer in a cell region of a substrate including the cell region and a logic region adjacent to the cell region. The method may include sequentially forming a first gate insulating film and a metal gate film in the logic region and the cell region, removing the metal gate film from at least a portion of the cell region and the logic region, forming a second gate insulating film on the first gate insulating film from which the metal gate film has been removed, forming a gate electrode film on the logic region and the cell region, and forming a plurality of memory cell elements disposed in the cell region and a plurality of circuit elements disposed in the logic region.

15 Claims, 34 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,679,133 B2 | 3/2010 | Son et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,310 B2 | 3/2013 | Shroff et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,735,931 B2 | 5/2014 | Han et al. |
| 8,766,295 B2 | 7/2014 | Kim |
| 8,932,925 B1 * | 1/2015 | Hong ............... H01L 29/66181 438/261 |
| 2006/0027858 A1 * | 2/2006 | Moon ................ H01L 27/105 257/315 |
| 2006/0121678 A1 | 6/2006 | Brask et al. |
| 2007/0241386 A1 * | 10/2007 | Wang ................ H01L 27/105 257/314 |
| 2008/0050875 A1 * | 2/2008 | Moon ................ H01L 27/105 438/257 |
| 2010/0163952 A1 | 7/2010 | Jan et al. |
| 2010/0181620 A1 | 7/2010 | Booth, Jr. et al. |
| 2011/0108903 A1 | 5/2011 | Xia et al. |
| 2011/0233648 A1 | 9/2011 | Seol et al. |
| 2012/0248523 A1 * | 10/2012 | Shroff ................ B82Y 10/00 257/316 |
| 2013/0234254 A1 | 9/2013 | Ng et al. |
| 2014/0038404 A1 | 2/2014 | Xia et al. |
| 2014/0264538 A1 * | 9/2014 | Yu .................... H01L 27/11546 257/316 |
| 2015/0279854 A1 * | 10/2015 | Hall ................. H01L 29/66545 438/591 |
| 2016/0064082 A1 * | 3/2016 | Hong ................ H01L 27/11546 365/185.05 |

\* cited by examiner

SEMICONDUCTOR DEVICE AND METHOD OF MANUFACTURING THE SAME

CROSS-REFERENCE TO RELATED APPLICATION

This application claims the priority and benefit of Korean Patent Application No. 10-2014-0166698 filed on Nov. 26, 2014, with the Korean Intellectual Property Office, the disclosure of which is incorporated herein by reference in its entirety.

BACKGROUND

The present inventive concepts relate to a semiconductor device and/or a method of manufacturing the same.

Research into a process of simultaneously manufacturing a cell element and a logic element in a flash memory device has been conducted. In forming a logic element together with a memory cell element in a flash memory device, research into methods of forming a logic element operating at a low voltage by using a high-k film and a metal gate in order to substantially prevent or reduce a gate leakage phenomenon that may occur in the logic element operating at a low voltage is ongoing.

In the case of forming a gate structure using a high-k film and a metal gate, the occurrence of the gate leakage phenomenon in the logic element operating at a low voltage may be substantially prevented or reduced. On the other hand, in the case that a memory cell element has a split gate structure, a flash memory device may be inappropriately operated due to a short phenomenon in which an erase gate and a select gate are electrically connected to each other by a metal gate, and a data retention error may occur.

SUMMARY

One example embodiment relates to a method of manufacturing a semiconductor device, in which a circuit device included in a logic region is manufactured using a high-k film and a metal gate.

In one example embodiment, the method of manufacturing a semiconductor device may include forming split gate structures respectively including a floating gate electrode layer and a control gate electrode layer in a cell region of a substrate including the cell region and a logic region adjacent to the cell region, sequentially forming a first gate insulating film and a metal gate film in the logic region and the cell region, removing the metal gate film from at least a portion of the cell region and the logic region, forming a second gate insulating film on the first gate insulating film from which the metal gate film has been removed, forming a gate electrode film on the logic region and the cell region, and forming a plurality of memory cell elements disposed in the cell region and a plurality of circuit elements disposed in the logic region by patterning the first and second gate insulating films, the gate electrode film, and a residue of the metal gate film.

The logic region may include a first region adjacent to the cell region and a second region adjacent to the first region.

In the removing of the metal gate film, the metal gate film may be removed in the first region and the at least a portion of the cell region, while the metal gate film may remain in the second region.

A gate electrode formed in the first region and a gate electrode formed in the second region may have different widths.

In the removing of the metal gate film, the metal gate film may be removed in the at least a portion of the cell region, while the metal gate film may remain in the first region and the second region.

The circuit elements disposed in the first region may be operated at an operating voltage higher than that of the circuit elements disposed in the second region.

The forming of the plurality of gate electrodes may include forming an erase gate electrode between the split gate structures and forming a select gate electrode on an outside of each of the split gate structures.

The removing of the metal gate film may include a wet-etching process in which the metal gate film is removed in at least a portion of the logic region and the cell region, using an etching solution containing an SC1 solution.

In the removing of the metal gate film, a portion of the metal gate film enclosing one end of the control gate electrode may be removed in an edge of the cell region.

The first gate insulating film may contain at least one of an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($LazO_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$)

In another example embodiment, the method of manufacturing a semiconductor device may include forming split gates respectively including a floating gate electrode and a control gate electrode in a cell region of a substrate including the cell region and a logic region adjacent to the cell region, forming a first gate electrode layer such that an upper surface of the substrate is exposed in at least a portion of the logic region, sequentially forming a first gate insulating layer and a metal gate layer on the upper surface of the substrate exposed in the logic region, forming a second gate electrode layer on the logic region and the cell region, and forming a plurality of memory cell elements disposed in the cell region and a plurality of circuit elements disposed in the logic region by patterning the first and second gate electrode layers, the metal gate layer, and the first gate insulating layer.

The logic region may include a first region and a second region, wherein the first region may be disposed between the cell region and the second region.

In the forming of the first gate insulating layer and the metal gate layer, the first gate insulating layer and the metal gate layer may be sequentially formed in the second region.

In the forming of the first gate insulating layer and the metal gate layer, the first gate insulating layer and the metal gate layer may be sequentially formed in the first and second regions.

The forming the plurality of memory cell elements may includes forming the first gate insulating layer and the metal gate layer in the logic region and the cell region, forming a mask layer exposing the cell region, and removing the metal gate layer from the cell region.

Gate electrodes formed in the logic region may include the second gate electrode layer, and gate electrodes formed in the cell region may include the first and second gate electrode layers.

In the forming of the plurality of gate electrodes, an erase gate electrode may be formed between the split gate structures by selectively removing the first gate electrode layer and the second gate electrode layer from the cell region, and a select gate electrode may be formed on an outside of each of the split gate structures.

In at least one example embodiment, the method of manufacturing a semiconductor device may include forming split gates respectively including a floating gate electrode and a control gate electrode in a cell region of a substrate including the cell region and a logic region adjacent to the cell region, forming a first gate electrode layer such that an upper surface of the substrate is exposed in at least a portion of the logic region, sequentially forming a first gate insulating layer and a metal gate layer on the logic region and the cell region, forming a second gate electrode layer on the metal gate layer, and forming a plurality of memory cell elements disposed in the cell region and a plurality of circuit elements disposed in the logic region by patterning the first and second gate electrode layers, the metal gate layer, and the first gate insulating layer.

The forming of the plurality of gate electrodes may include forming the gate electrodes by removing the second gate electrode layer, the metal gate layer, and the first gate insulating layer from the cell region.

Gate electrodes formed in the cell region may include the first gate electrode layer, and gate electrodes formed in the logic region may include the second gate electrode layer.

In another example embodiment, the method includes a method of manufacturing a semiconductor device having a split gate structure including forming a split gate structure on a substrate including a cell region and a logic region; sequentially forming a first gate insulating film and a metal gate film on the split gate structures; removing a portion of the metal gate film; forming a second gate insulating film on the first gate insulating film; forming a gate electrode film on the cell region and the logic region; and forming an insulating layer, a first circuit element, a second circuit element, and a bit line on the substrate.

BRIEF DESCRIPTION OF DRAWINGS

The various features and advantages of the non-limiting embodiments herein may become more apparent upon review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

DETAILED DESCRIPTION

Figure 1:
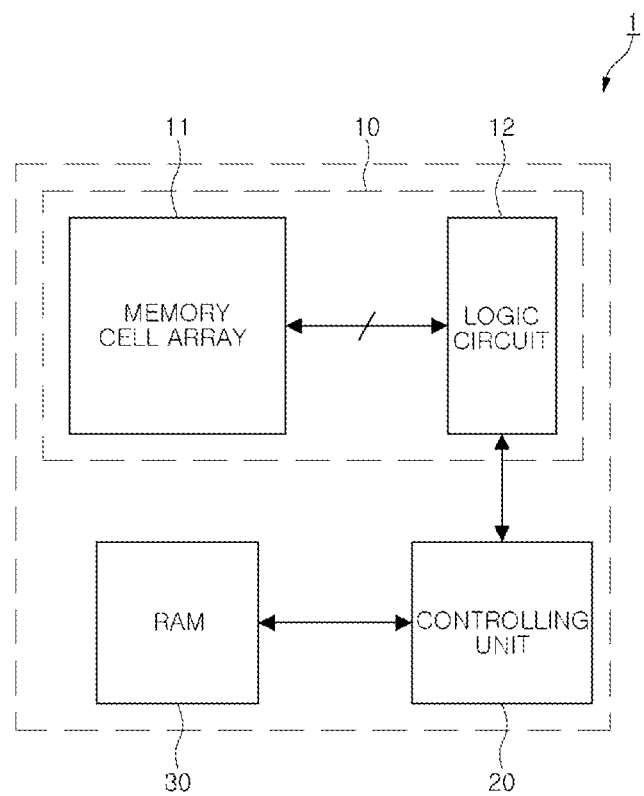
FIG. 1 is a block diagram schematically illustrating an electronic device in which a semiconductor device may be included, according to at least one example embodiment.

Example embodiments will now be described in detail with reference to the accompanying drawings.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram schematically illustrating an electronic device in which a semiconductor device may be included, according to at least one example embodiment.

Referring to FIG. 1, an electronic device 1 may include a flash memory 10, a controller 20, and a random-access memory (RAM) 30. The flash memory 10 may include a memory cell array 11 storing data and a logic circuit 12. The memory cell array 11 may have a plurality of memory blocks. That is, the electronic device may be a memory device.

The logic circuit 12 may control operations, such as erasing data stored on a specific memory block or entire memory blocks, writing new data, reading stored data, and the like, according to a command transferred from the controller 20. The controller 20 may control a reading operation, a writing operation, an erasing operation and the like, performed by the logic circuit 12 in response to a request transferred from a host connected to the electronic device 1.

The controller 20 may configure a memory controller together with the RAM 30. The memory controller may further include a host interface, a flash interface, an ECC circuit, a bad page manager and the like.

An operation of the RAM 30 may be controlled by the controller 20, and the PAM 30 may be used as a work memory, a buffer memory, a cache memory or the like. In the case that the RAM 30 is used as a work memory, data processed by the controller 20 may be temporarily stored in the RAM 30. In the case that the RAM 30 is used as a buffer memory, the RAM 30 may be used in buffering data transceived between the host and the electronic device 1. In the case that the RAM 30 is used as a cache memory, the flash memory 10 operating at a low speed may operate at a high speed.

Figure 2:
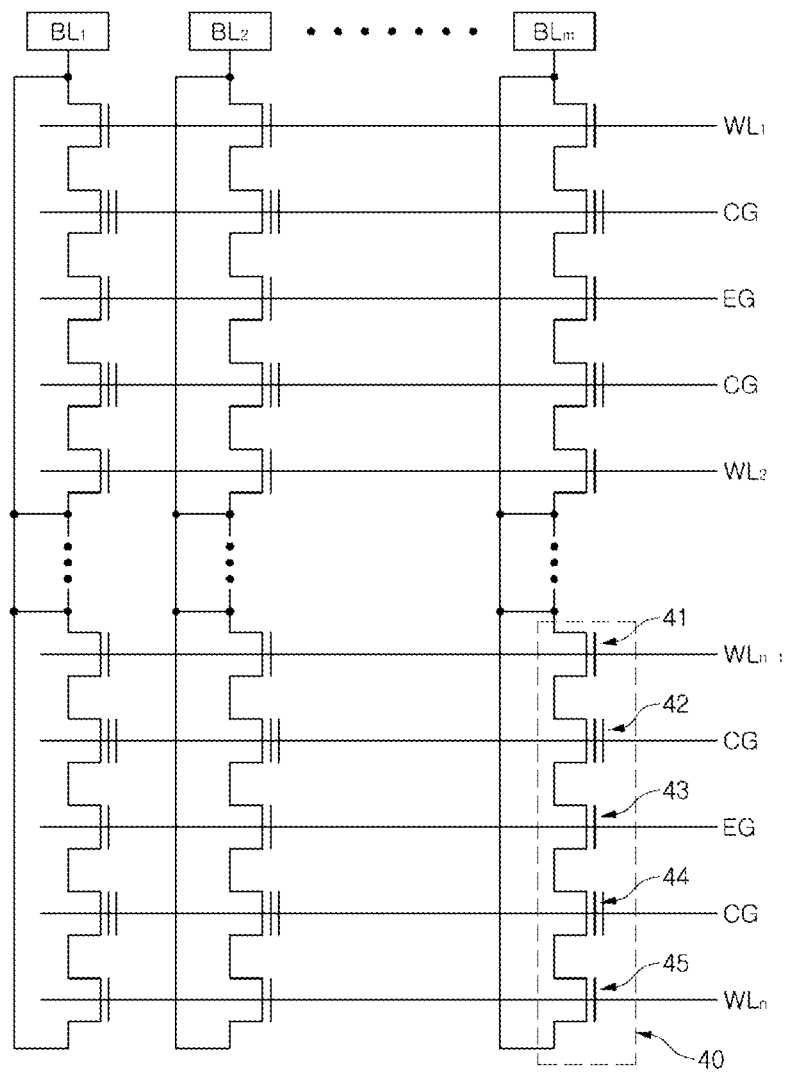
FIG. 2 is a circuit diagram illustrating memory cell devices that may be included in a memory cell array according to at least one example embodiment.

FIG. 2 is a circuit diagram illustrating memory cell devices that may be included in a memory cell array according to at least one example embodiment.

Referring to FIG. 2, memory cell elements 40 may have a plurality of gate electrodes. A single memory cell element 40 may be connected to two word lines among word lines WL1 to WLn (WL) and may be connected to a single bit line among bit lines BL1 to BLm (BL). In FIG. 2, the memory cell array 11 may be connected to the logic circuit through n-number of word lines WL1-WLn and m-number of bit lines BL1-BLm (n and m are respective natural numbers equal to or greater than 2).

Each of the memory cell elements 40 may include select gate electrode layers 41 and 45 connected to the word lines WL, control gate electrode layers 42 and 44 connected to a control gate line CG, an erase gate electrode layer 43 connected to an erase gate line EG, and the like. The control gate electrode layers 42 and 44 may have a floating gate electrode structure.

As indicated in FIG. 2, a single memory cell device 40 may have a symmetric structure with respect to the erase gate electrode layer 43. Thus, the memory cell device 40 may have a split structure and on side surfaces of the erase gate electrode layer 43, the control gate electrode layers 42 and 44 and the select gate electrode layers 41 and 45 may be respectively disposed. To the respective gate electrode layers 41 to 45, levels of voltage as indicated in the following Table 1 may be applied. In the following Table 1, SL is a source line included in the memory cell device 40.

TABLE 1

| Operation | | WL | CG | EG | BL | SL |
|---|---|---|---|---|---|---|
| Writing | SELECT | 0.8 V | 9.0 V | 4.5 V | 0.3 V | 4.5 V |
| | UNSELECT | 0 V | 0 V | 0 V | 1.1 V | VDD/3 |
| Erasing | SELECT | 0 V | −8.0 V | 9.5 V | 0 V | 0 V |
| | UNSELECT | 0 V | 1.1 V | 0 V | 0 V | 0 V |
| Reading | SELECT | 1.1 V | 1.5 V | 0 V | 0.4 V | 0 V |
| | UNSELECT | 0 V | 1.5 V | 0 V | 0 V | FLOAT |

The writing operation may be performed on a bit-by-bit basis. First, in order to provide coupling to a floating gate electrode positioned below the control gate electrode layers 42 and 44, a voltage of about 9.0 V may be applied to the control gate electrode layers 42 and 44. A voltage of about 4.5 V, half of 9.0 V, may be applied to the source line SL and the erase gate electrode layer 43. A voltage of about 0.8V may be applied to the word line WL and a voltage of about 0.3V or lower may be applied to the bit line BL, such that a current of several microamperes may flow in the bit line BL.

In the erasing operation, a voltage of about 9.5 V may be applied to the erase gate electrode layer 43 of the memory cell device 40 selected to erase data. In this case, a negative (−) voltage of about −8.0V may be applied to the control gate electrode layers 42 and 44 and accordingly, electron tunneling may occur from the floating gate electrode positioned below the control gate electrode layers 42 and 44 to the erase gate electrode layer 43.

Figure 3:
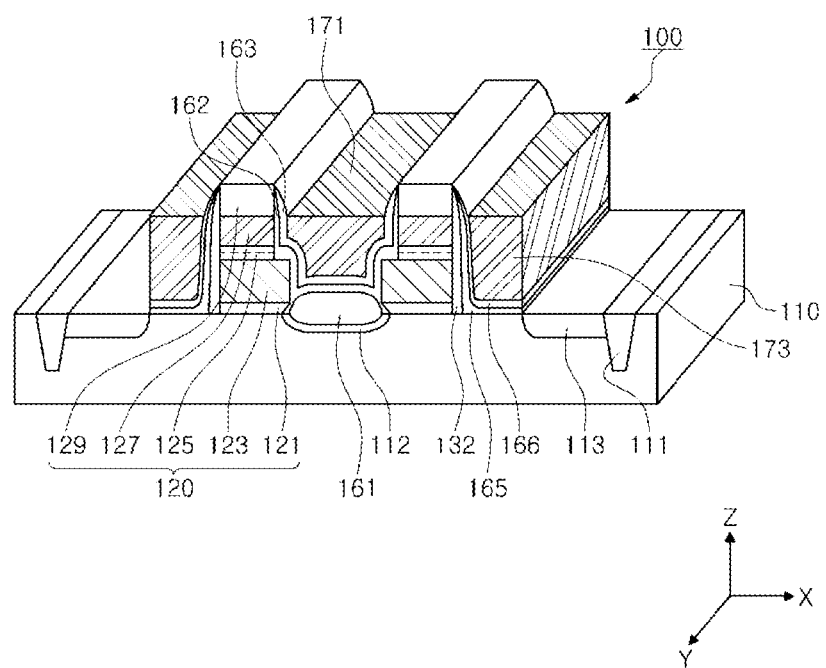
FIG. 3 is a perspective view illustrating a memory cell device that may be included in a semiconductor device according to at least one example embodiment.

FIG. 3 is a perspective view illustrating a memory cell element that may be included in a semiconductor device.

Referring to FIG. 3, a memory cell element 100 according to example embodiments may include a substrate 110, a control gate electrode layer 127 formed on the substrate 110, an erase gate electrode layer 171, a select gate electrode layer 173, and the like. The memory cell element 100 may have a split gate structure in which the control gate electrode layer 127 and the select gate electrode layer 173 are disposed on both sides of the erase gate electrode layer 171 in a first direction (in an X-axis direction of FIG. 3).

In example embodiments, the memory cell element 100 may include a pair of split gate structures 120 respectively including a floating gate insulating layer 121, a floating gate electrode layer 123, a control gate insulating layer 125, a control gate electrode layer 127, and a hard mask layer 129 sequentially stacked on the substrate 110. In the split gate structure 120, the floating gate insulating layer 121 may contain a silicon oxide and the floating gate electrode layer 123 may contain polysilicon or a metal doped with an impurity.

The control gate insulating layer 125 may contain a silicon oxide, a silicon nitride or the like. In example embodiments, the control gate insulating layer 125 may have a multilayer structure having an oxide layer—a nitride layer—an oxide layer sequentially stacked therein. The control gate electrode layer 127 may contain polysilicon doped with an impurity in a similar manner to the floating gate electrode layer 123 or the like, and the hard mask layer 129 may contain a silicon nitride.

Between the pair of split gate structures 120, a first impurity region 112 penetrating through an upper surface of the substrate 110 to a predetermined and/or desired depth and doped with an impurity may be provided. The first impurity region 112 may provide a source region, and an oxide layer 161 may be provided on the first impurity region 112. The oxide layer 161 may contain a silicon oxide and have a bulged central portion thereof.

A first erase gate insulating layer 162 and a second erase gate insulating layer 163 may be provided on the oxide layer 161. The first erase gate insulating layer 162 may contain a silicon oxide or a material having a dielectric constant higher than that of the silicon oxide. In example embodiments, the first erase gate insulating layer 162 may have a thickness of several tens to several hundredths of Å. In the case that the first erase gate insulating layer 162 is formed of a material having a dielectric constant higher than that of a silicon oxide, the first erase gate insulating layer 162 may contain at least one of an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide (HfAlxOy), and a praseodymium oxide ($Pr_2O_3$). Meanwhile, the second erase gate insulating layer 163 may contain a silicon oxide and may have a thickness of several tenths of Å. The erase gate electrode layer 171 may be provided on the second erase gate insulating layer 163 and may contain doped polysilicon.

A split gate spacer 132 and first and second select gate insulating layers 165 and 166 may be provided on an outside of each of the split gate structures 120. The split gate spacer 132 may contain a silicon oxide or a silicon nitride and have a thickness of several hundredths of Å, for example, a thickness of about 300 Å to about 400 Å.

The first and second select gate insulating layers 165 and 166 may contain the same materials as those of the first and second erase gate insulating layers 162 and 163, respectively. That is, the second select gate insulating layer 166 may contain a silicon oxide similar to the case of the second erase gate insulating layer 163. The first select gate insulating layer 165 may contain a silicon oxide or a material having a dielectric constant higher than that of the silicon oxide, similarly to the case of the first erase gate insulating layer 162. In a manufacturing process, the respective first and second select gate insulating layers 165 and 166 may be formed in the same processes as those of the first and second erase gate insulating layers 162 and 163.

The select gate electrode layer 173 may be formed on the first and second select gate insulating layers 165 and 166. The select gate electrode layer 173 may contain doped polysilicon and may be connected to the logic circuit through the word line WL. In a partial region of the substrate 110 adjacent to the select gate electrode layer 173, a second impurity region 113 doped with an impurity may be provided, and an element separation layer 111 may be formed on the outside of the second impurity region 113.

As illustrated in FIG. 3, the split gate structures 120 may be extended in a second direction (a Y-axis direction of FIG. 3) intersecting with the first direction (a X-axis direction of FIG. 3). The erase gate electrode layer 171 positioned between the split gate structures 120, and the select gate electrode layer 173 disposed on the outside of each of the split gate structures 120 may also be extended in the second direction.

The memory cell element 100 may be covered with an interlayer insulating layer, and through a bit line contact portion formed within the interlayer insulating layer, the second impurity region 113 may be connected to the bit line BL.

Figure 4:
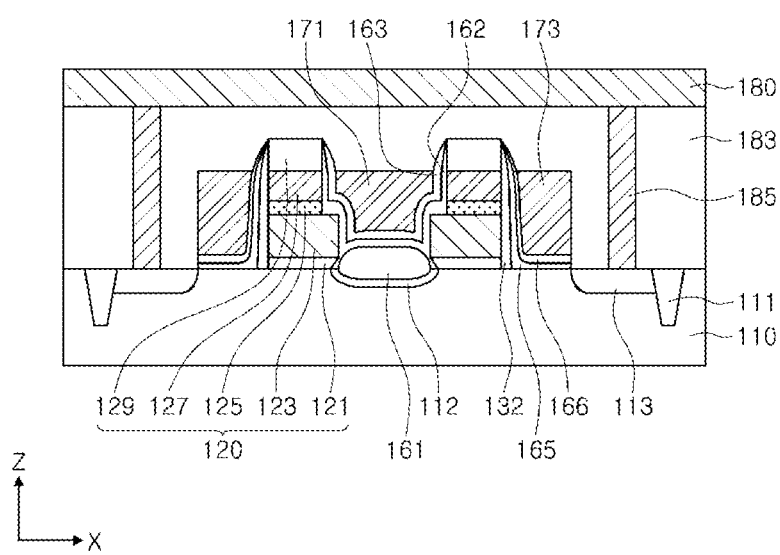
FIG. 4 is a cross-sectional view of the memory cell device illustrated in FIG. 3.

FIG. 4 is a cross-sectional view of the memory cell element illustrated in FIG. 3, and may be a cross-sectional view of the memory cell element 100, corresponding to X-Z plane.

Referring to FIG. 4, an interlayer insulating layer 183 may be formed on the memory cell element 100. The interlayer insulating layer 183 may contain a silicon oxide, for example, a high density plasma (HDP) oxide layer or a tetraethyl ortho-silicate (TEOS) oxide layer. A bit line 180 may be formed on the interlayer insulating layer 183.

As illustrated in the circuit diagram of FIG. 2, the bit line 180 may be connected to the second impurity region 113 of the memory cell element 100. A bit line contact portion 185 for electrically connecting the bit line 180 and the second impurity region 113 to each other may be formed within the interlayer insulating layer 183. The bit line 180 and the bit line contact portion 185 may contain a metal, a metallic nitride, doped polysilicon, or the like.

Figure 5:
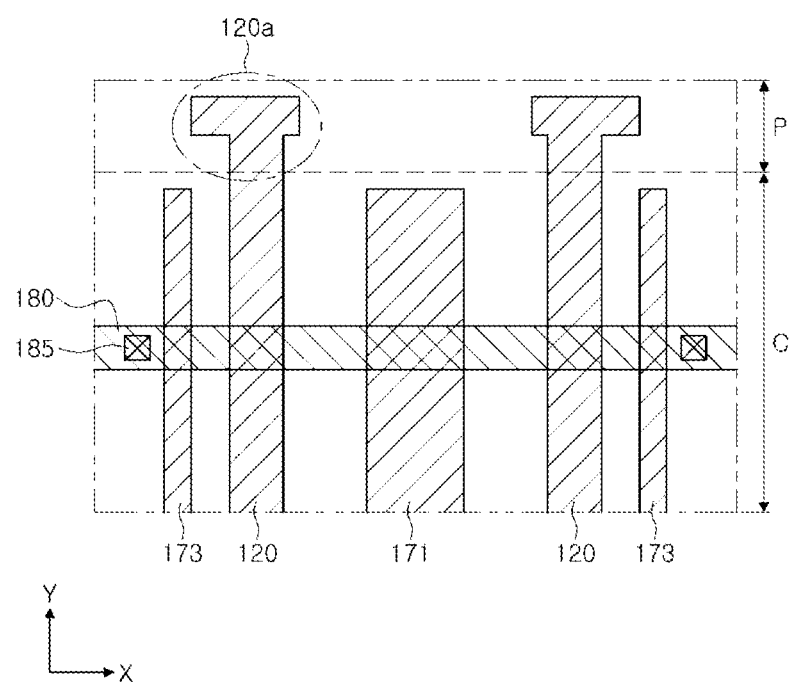
FIG. 5 is a plan view of the memory cell device illustrated in FIG. 3.

Referring to FIG. 5, the split gate structures 120, the erase gate electrode layer 171, and the select gate electrode layer 173 included in the memory cell element 100 may be elongated and may extend in the second direction (Y-axis direction). The memory cell element 100 may be disposed in a cell region C of the memory cell array 11. The bit line 180 may extend in the first direction (X-axis direction) intersecting with the second direction and may be connected to the second impurity region 113 of the memory cell element 100 through the bit line contact portion 185.

Referring to FIG. 5, the memory cell array 11 may further include a peripheral region P defined as an edge of the cell region C. In the peripheral region P, each of the split gate structures 120 may have a support portion 120a having a generally T-shape. The split gate structure 120 may have a height relatively greater than those of the erase gate electrode layer 171 and the select gate electrode layer 173. The split gate structure 120 may be elongated and may extend in the Y-axis direction. The support portion 120a may substantially prevent or lessen the split gate structure 120 from toppling over.

As described above with reference to FIG. 1, the memory cell array 11 may be electrically connected to the logic circuit 12 transferring an electrical signal for controlling reading and writing operations. The logic circuit 12 may be formed on the substrate 110 such as the memory cell array 11. That is, the logic circuit 12 may be provided in the edge of the cell region C in the first direction (X-axis direction) on the substrate 110. The logic circuit 12 may be provided in a logic region L adjacent to the cell region C, and a plurality of circuit devices may be formed in the logic region L.

The plurality of circuit elements formed in the logic region L may include a first circuit element able to receive a relatively higher voltage and a second circuit element operated by receiving a relatively low voltage. The first circuit element and the second circuit element may be formed in first and second regions, respectively, defined as different regions in the logic region L. In example embodiments, the first region may be disposed between the cell region C and the second region.

Meanwhile, the description "the first circuit element receives a relatively higher voltage" and the description "the second circuit element receives a relatively lower voltage" may be understood as indicating a difference in relative input voltages between the first circuit element and the second circuit element, rather than indicating absolute numerical values of voltage. That is, the descriptions shall be understood that a gate electrode layer of the first circuit element may receive a relatively higher voltage as compared to that of a gate electrode layer of the second circuit element.

At least a portion of the first and second circuit elements may have a structure in which a high-k layer and a metal gate layer are sequentially stacked in order to substantially prevent or lessen a gate leakage phenomenon that may occur in a gate electrode. The high-k layer may be defined as a layer containing a material having a relatively higher dielectric constant than that of a silicon oxide. The high-k layer may contain, for example, at least one of an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$). The metal gate layer formed on the high-k layer may contain a metallic nitride, for example, a titanium nitride (TiN).

Hereinafter, with reference to FIG. 6 through FIG. 34, a method of manufacturing a semiconductor device according to example embodiments will be described.

FIG. 6 through FIG. 19 illustrate a method of manufacturing a semiconductor device according to example embodiments.

Figure 6:
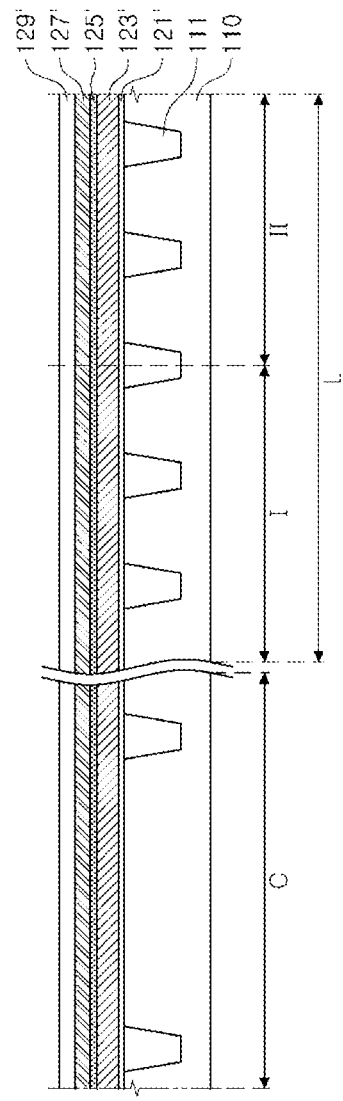
FIG. 6 through FIG. 19 illustrate a method of manufacturing a semiconductor device according to at least one example embodiment.

Referring to FIG. 6 first, a plurality of element separation layers 111 may be formed on the substrate 110. Between the element separation layers 111, a well region to which an impurity is injected by an ion injection method or the like may be provided. The substrate 110 and regions on the substrate 110 may include a cell region C and a logic region L adjacent to the cell region C.

As described above, the cell region C may be defined as a region in which the memory cell device 100 is disposed, and the logic region L may be defined as a region in which a plurality of circuit elements operating the memory cell device 100 are disposed. The logic region L may include a first region I and a second region II, and a first circuit element and a second circuit element may be formed in the respective first and second regions I and II. The first circuit element may receive a voltage relatively higher than that of the second circuit element. In the case that the first circuit element included in the first region I receives a voltage relatively higher than that of the second circuit, the element separation layers 111 included in the first region I may have widths or thicknesses greater than those of the element separation layers 111 included in the second region II.

Referring to FIG. 6, a floating gate insulating film 121', a floating gate electrode film 123', a control gate insulating film 125', a control gate electrode film 127', and a hard mask film 129' may be sequentially formed on the substrate 110. The floating gate insulating film 121' may contain a silicon oxide and the floating gate electrode film 123' may contain doped polysilicon. In at least one example embodiment, the floating gate electrode film 123' may contain a metal. The control gate insulating film 125' may contain at least one of a silicon oxide and a silicon nitride, and the control electrode film 127' may contain doped polysilicon or a metal, and the hard mask film 129' may contain a silicon nitride.

Figure 7:
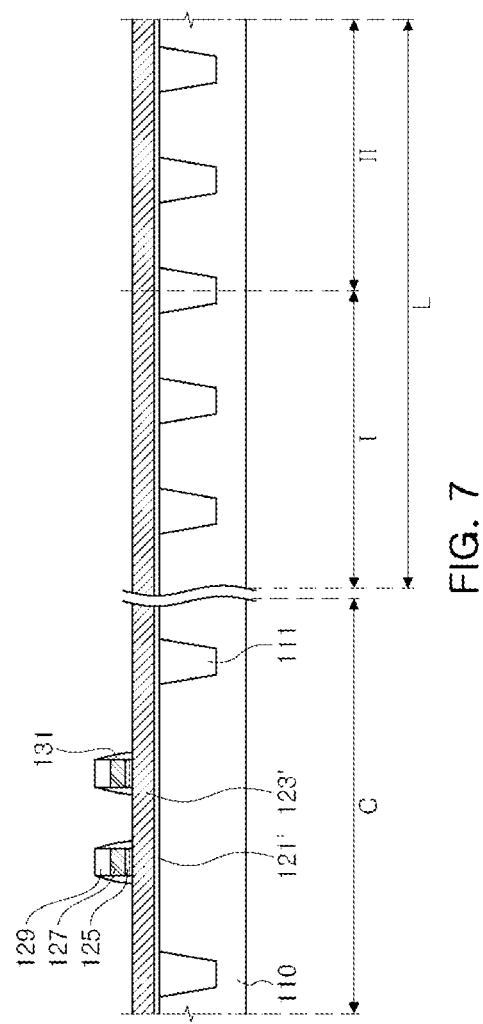

Referring to FIG. 7, the hard mask film 129' may be selectively removed to form the hard mask layer 129. The hard mask layer 129 may be formed to be positioned within the cell region C of the substrate 110. As illustrated in the perspective view of FIG. 3, the hard mask layer 129 may be extended in the second direction (Y-axis direction).

When the hard mask layer 129 is formed, the control gate electrode layer 127 and the control gate insulating layer 125 may be formed on a lower portion of the hard mask layer 129, using the hard mask layer 129 as a mask layer. In example embodiments, two hard mask layers 129 separated from each other in the first direction (X-axis direction) may be formed in the cell region C of the substrate 110. On the lower portion of each hard mask layer 129, the control gate electrode layer 127 and the control gate insulating layer 125 may be formed. Accordingly, the floating gate electrode film 123' may be partially exposed. Meanwhile, the first spacers 131 may be formed on side surfaces of the hard mask layer 129, the control gate electrode layer 127 and the control gate insulating layer 125. The first spacers 131 may contain a silicon nitride.

Figure 8:
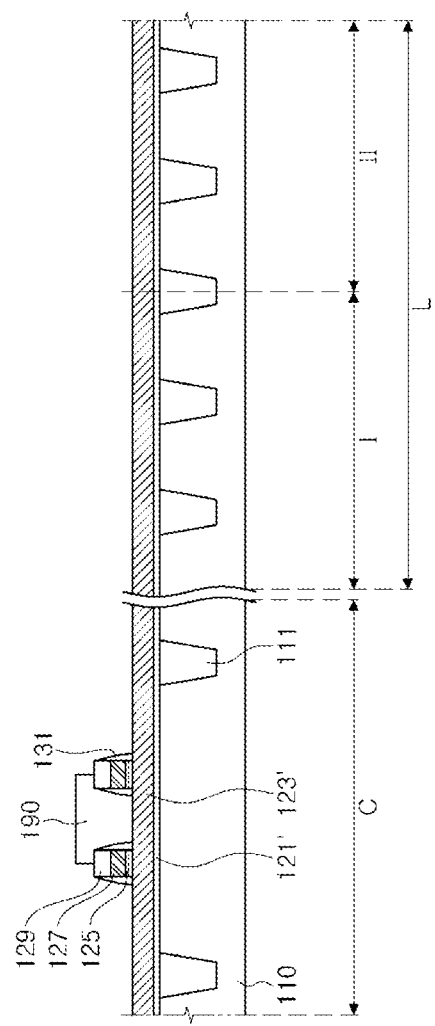

Referring to FIG. 8, after a first photoresist pattern 190 is formed between the hard mask layers 129, portions of the first spacers 131 not covered by the first photoresist pattern 190 may be removed. When portions of the first spacers 131 are removed, as illustrated in FIG. 9, the first photoresist pattern 190 may be removed, and using the hard mask layers 129 and remaining portions of the first spacers 131 as masks, the floating gate insulating film 121' and the floating gate electrode film 123' may be selectively removed.

Figure 9:
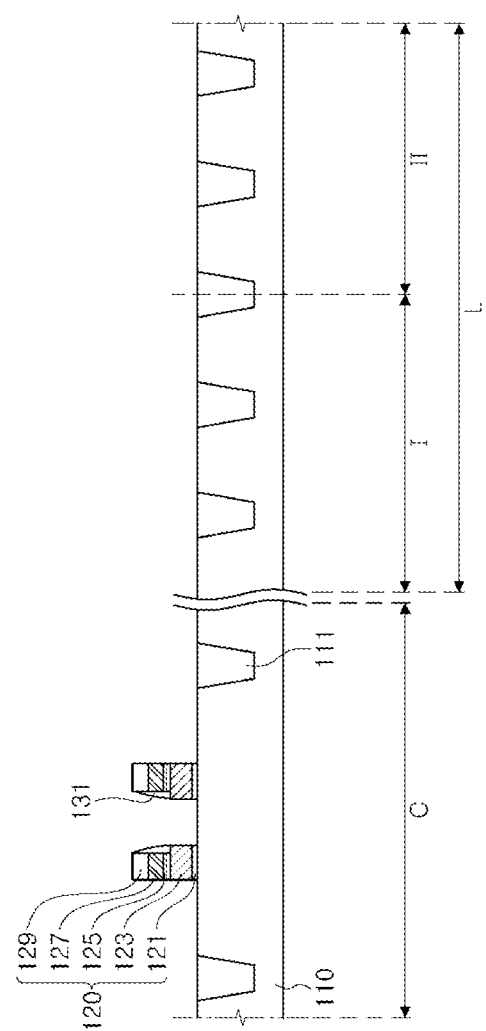

Thus, as illustrated in FIG. 9, the split gate structures 120 may be formed. Each of the split gate structures 120 may include the floating gate insulating layer 121, the floating gate electrode layer 123, the control gate insulating layer 125, the control gate electrode layer 127, and the hard mask layer 129 sequentially stacked from an upper surface of the substrate 110.

Figure 10:
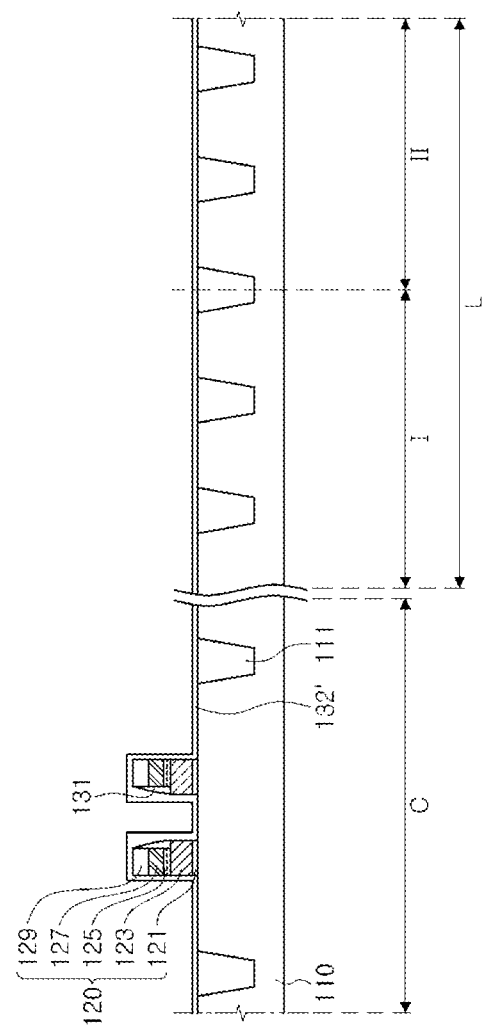
Figure 11:
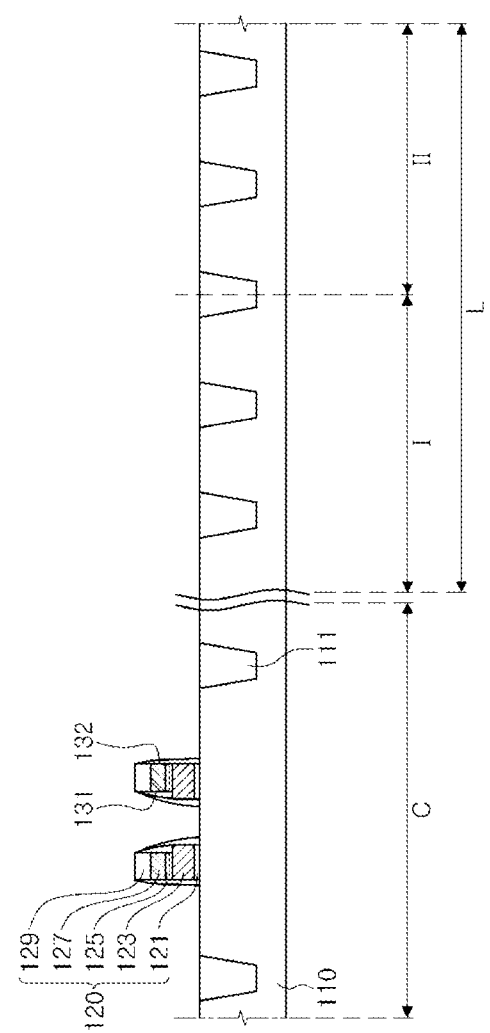

Referring to FIG. 10, a second spacer film 132' may be formed on the split gate structures 120 and the first spacers 131. The second spacer film 132' may contain a silicon oxide or a silicon nitride. By selectively removing the second spacer film 132' and maintaining a portion thereof, the split gate spacer 132 may be formed as illustrated in FIG. 11. In the case that the second spacer film 132' is formed to contain a silicon oxide, the second spacer film 132' may contain a middle temperature oxide (MTO) in example embodiments. The second spacer film 132' may have a thickness of several hundredths of Å.

Figure 12:
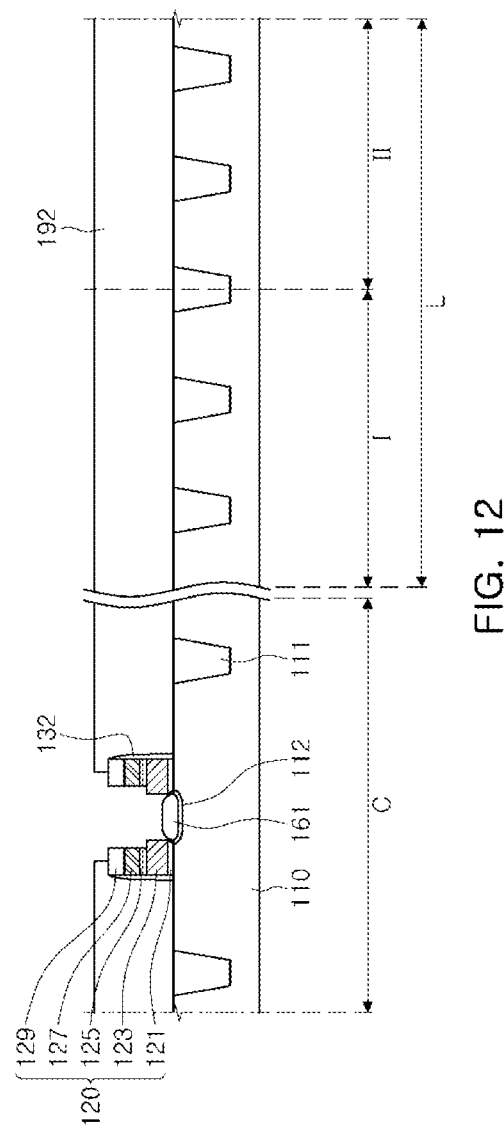

Then, referring to FIG. 12, a second photoresist pattern 192 may be formed to cover side surfaces and upper surfaces of the split gate structures 120. The second photoresist pattern 192 may expose a space between the split gate structures 120 and the space between the split gate structures 120 may be selectively etched to remove the first spacers 131. After removing the first spacers 131, the first impurity region 112 may be formed in a partial region of the substrate 110 positioned between the split gate structures 120 by injecting an impurity into the region, using an ion injection method or the like. The impurity injected into the first impurity region 112 may be an n-type impurity or a p-type impurity.

Meanwhile, the oxide layer 161 may be formed by oxidizing the partial region of the substrate 110 positioned on the first impurity region 112. The oxide layer 161 may be extended in the second direction (Y-axis direction), similarly to the split gate structures 120 and have the bulged central portion. In example embodiments, the oxide layer 161 may be formed by thermally oxidizing or wet-oxidizing an exposed region of the substrate 110.

Figure 13:
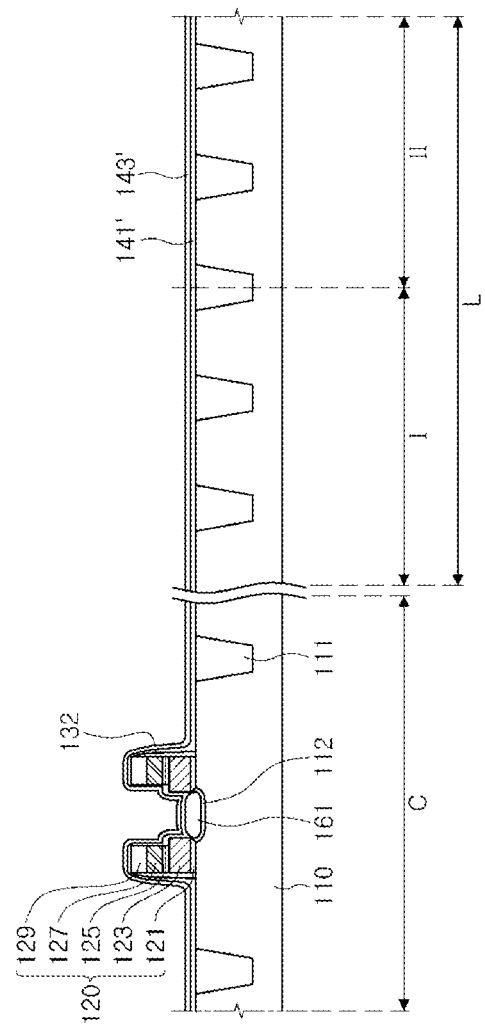

Then, referring to FIG. 13, after removing the second photoresist pattern 192, a first gate insulating film 141' and a metal gate film 143' may be sequentially formed on the split gate structures 120, the oxide layer 161 and the substrate 110. The first gate insulating film 141' may be formed in the logic region L and may be an insulating layer for forming a circuit element having a structure of a high-k layer—a metal gate layer. The first gate insulating film 141' may be formed of a material having a higher dielectric constant than that of a silicon oxide, for example, at least one of an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$). The metal gate film 143' may contain a metal, a metallic nitride or the like.

Figure 14:
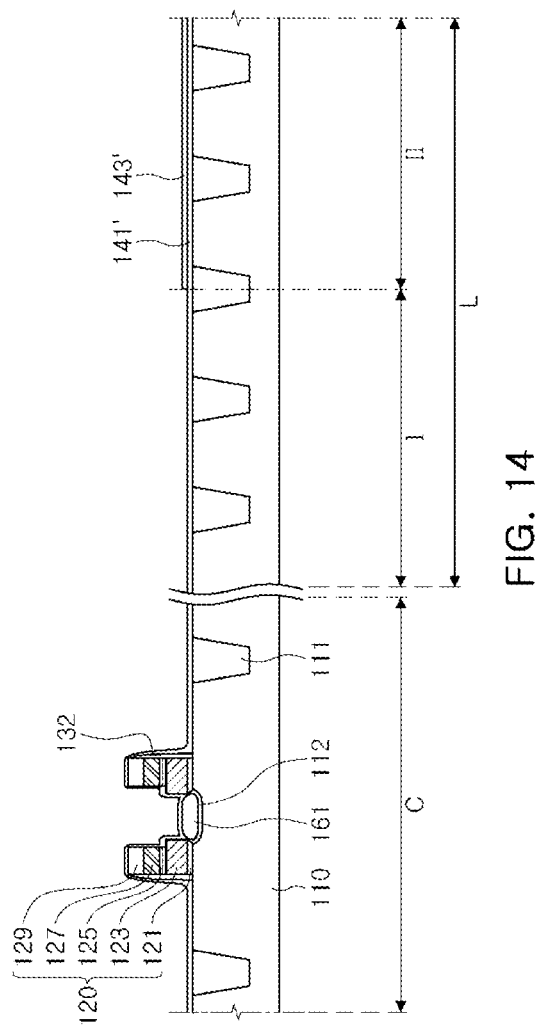

Referring to FIG. 14, a portion of the metal gate film 143' may be removed. In this case, the metal gate film 143' may be partially removed such that a remaining portion thereof may be present in at least a partial region of the logic region L. FIG. 14 illustrates at least one example embodiment in which the metal gate film 143' only remains in the second region II of the logic region L. Alternatively, the metal gate film 143' may remain over the entirety of the logic region L or the metal gate film 143' may only remain in the first region I.

Figure 15:
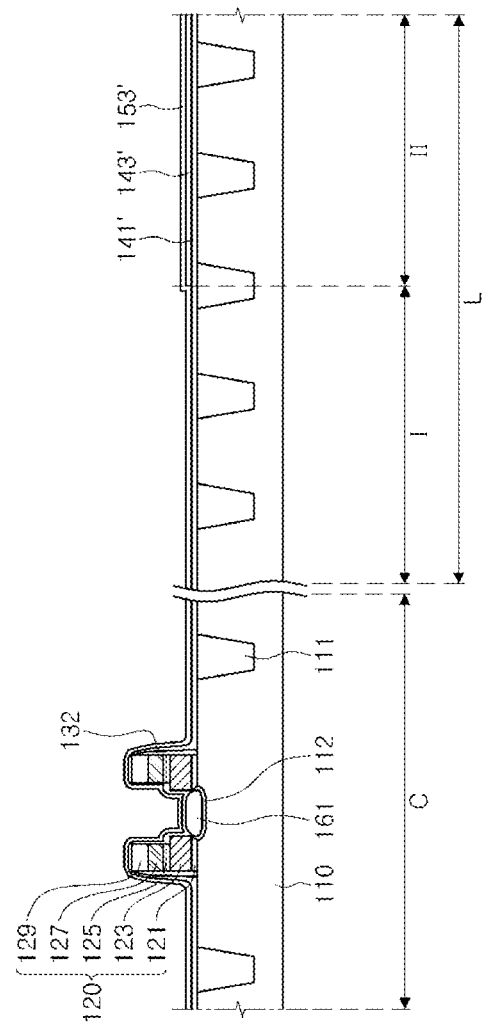

Referring to FIG. 15, a second gate insulating film 153' may be formed on the first gate insulating film 141' and the remaining portion of the metal gate film 143'. The second gate insulating film 153' may contain a silicon oxide or the like.

Figure 16:
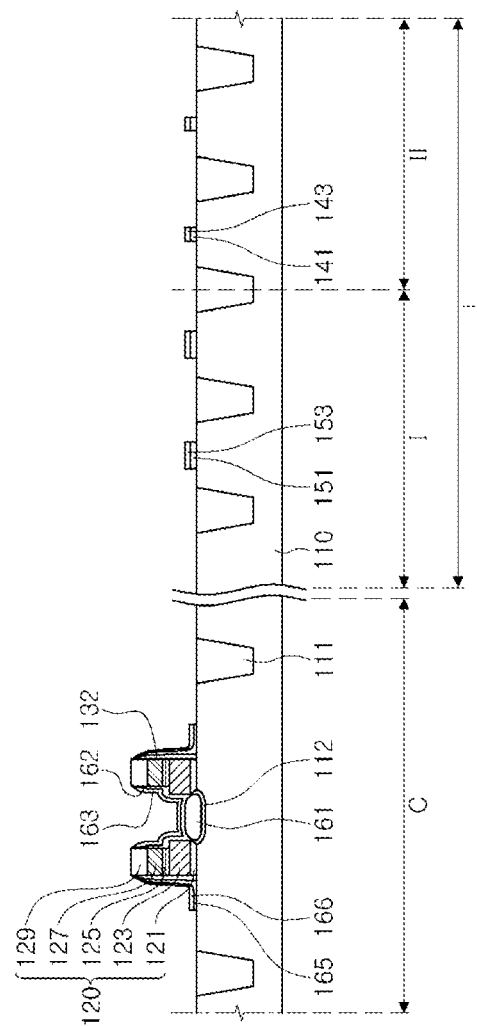

Then, referring to FIG. 16, the first and second gate insulating films 141' and 153' and the remaining portion of the metal gate film 143' may be selectively removed. The first and second gate insulating films 141' and 153' may remain on a region between the split gate structures and a region covering a side surface of the split gate spacer 132. The residues of the first and second gate insulating films 141' and 153' remaining between the split gate structures 120 may form the first and second erase gate insulating layers 162 and 163, respectively. The residues of the first and second gate insulating films 141' and 153' remaining on the side surface of the split gate spacer 132 may form the first and second select gate insulating layers 165 and 166, respectively.

Meanwhile, as illustrated in FIG. 16, the first and second gate insulating films 141' and 153' remaining in the first region I of the logic region L may provide first and second high-voltage gate insulating layers 151 and 153 for forming the first circuit element. In addition, the first gate insulating film 141' remaining in the second region II of the logic region L may form a low-voltage gate insulating layer 141 for forming the second circuit element. The metal gate layer 143 may be formed on the low-voltage gate insulating layer 141 and thus, the second circuit element may have a structure of a high-k layer—a metal gate layer.

Figure 17:
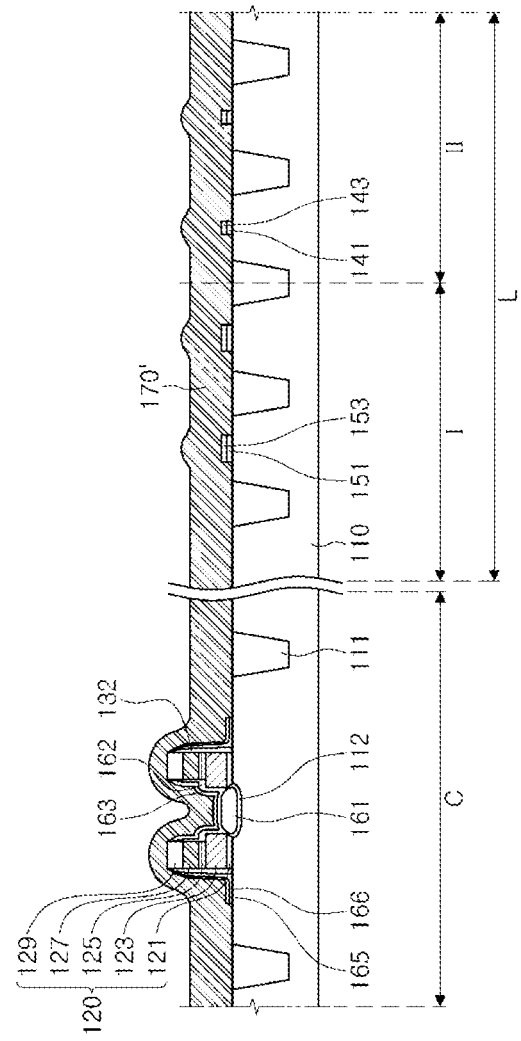
Figure 18:
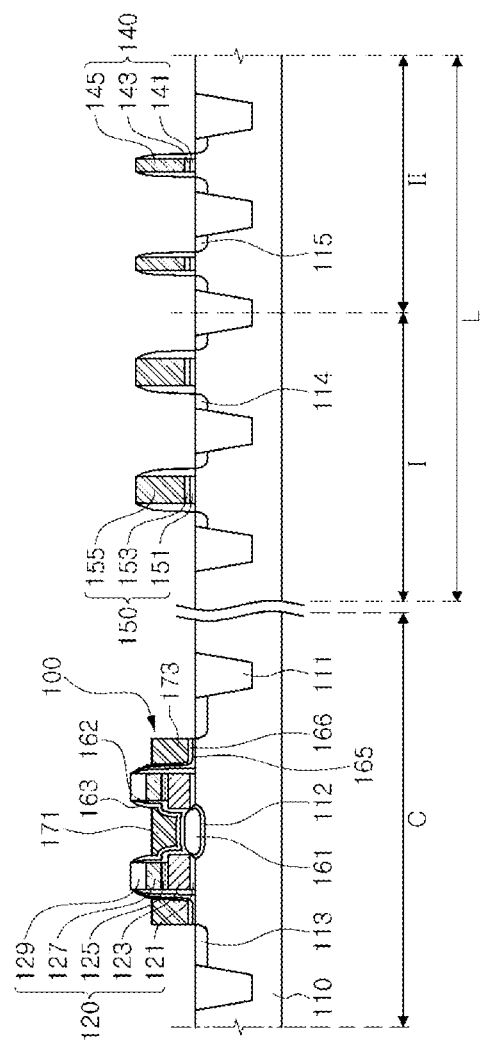

Referring to FIG. 17, a gate electrode film 170' may be formed over the cell region C and the logic region L on the substrate 110. The gate electrode film 170' may contain polysilicon or a metal doped with an impurity. The gate electrode film 170' may be selectively removed using a mask layer, such that the erase gate electrode layer 171, the select gate electrode layer 173, and a low-voltage gate electrode layer 145 and a high-voltage gate electrode layer 155 of respective first and second circuit devices 140 and 150 may be formed, as illustrated in FIG. 18. Heights of the gate electrode film 170' and the respective gate electrode layers 171, 173, 145 and 155 illustrated in FIGS. 17 and 18 are merely provided by way of example, and are not limited thereto.

When the erase gate electrode layer 171, the select gate electrode layer 173, the high-voltage gate electrode layer 155, and the low-voltage gate electrode layer 145 are formed, second to fourth impurity regions 113, 114, and 115 may be formed by injecting impurities into partial regions of the substrate 110 adjacent to the respective gate electrode layers 171, 173, 145 and 155. Each of the second to fourth impurity regions 113, 114, and 115 may be provided as at least one among drain regions and source regions of the memory cell device 100, the first circuit element 150, and the second circuit element 140.

Figure 19:
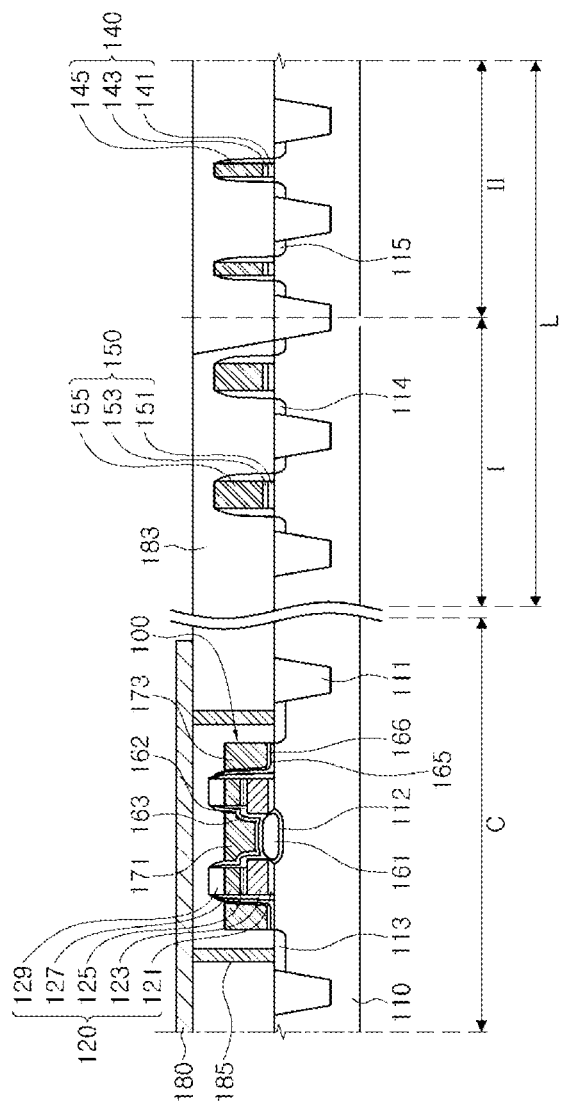

Then, referring to FIG. 19, the interlayer insulating layer 183 covering the memory cell device 110, the first circuit element 150 and the second circuit element 140, the bit line 180, and the bit line contact portion 185 may be formed on the substrate 110. The bit line 180 may be disposed on the interlayer insulating layer 183 and may be electrically connected to the second impurity region 113 adjacent to the memory cell device 100 through the bit line contact portion 185. The bit line 180 and the bit line contact portion 185 may contain a metal, a metallic nitride or doped polysilicon, and the interlayer insulating layer 183 may contain a silicon oxide.

A method of manufacturing a semiconductor device is described with reference to FIGS. 6 through 19. The metal gate film 143' formed in the cell region C in which the memory cell device 100 is disposed may be completely removed. Thus, defects in which the select gate electrode layer 173 and the erase gate electrode layer 171 are electrically connected to each other by the remainder of the metal gate film 143' remaining in the cell region C may be substantially prevented or lessened.

In example embodiments, the metal gate film 143' may only be removed from the peripheral region P adjacent to the cell region C. That is, the metal gate film 143' may be selectively removed from the vicinity of the support portion 120a of each split gate structure 120 that may cause short defects in which the select gate electrode layer 173 and the erase gate electrode layer 171 are electrically connected to each other.

FIG. 20 through FIG. 30 are illustrations of a method of manufacturing a semiconductor device according to example embodiments.

Figure 20:
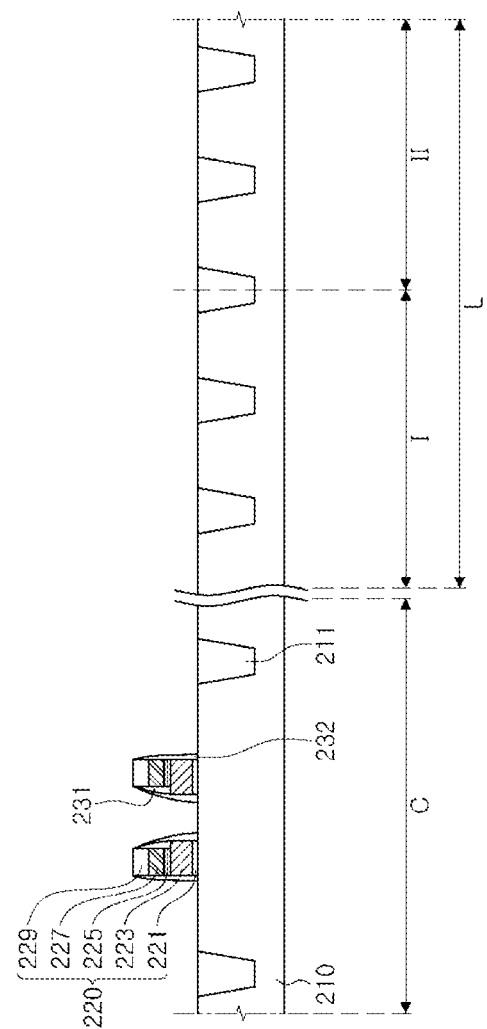
FIG. 20 through FIG. 30 illustrate a method of manufacturing a semiconductor device according to at least one example embodiment.

Referring to FIG. 20, split gate structures 220 may be formed on a substrate 210. Each of the split gate structures 220 may include a floating gate insulating layer 221, a floating gate electrode layer 223, a control gate insulating layer 225, a control gate electrode layer 227, and a hard mask layer 229 sequentially stacked from an upper surface of the substrate 210. A first spacer 231 and a split gate spacer 232 may be formed on side surfaces of each split gate structure 220, respectively.

Element separation layers 211 may be formed on the substrate 210. Between the element separation layers 211, a well region to which an impurity is injected by an ion injection method or the like may be provided. The substrate 210 and regions on the substrate 210 may include a cell region C and a logic region L adjacent to the cell region C.

Figure 21:
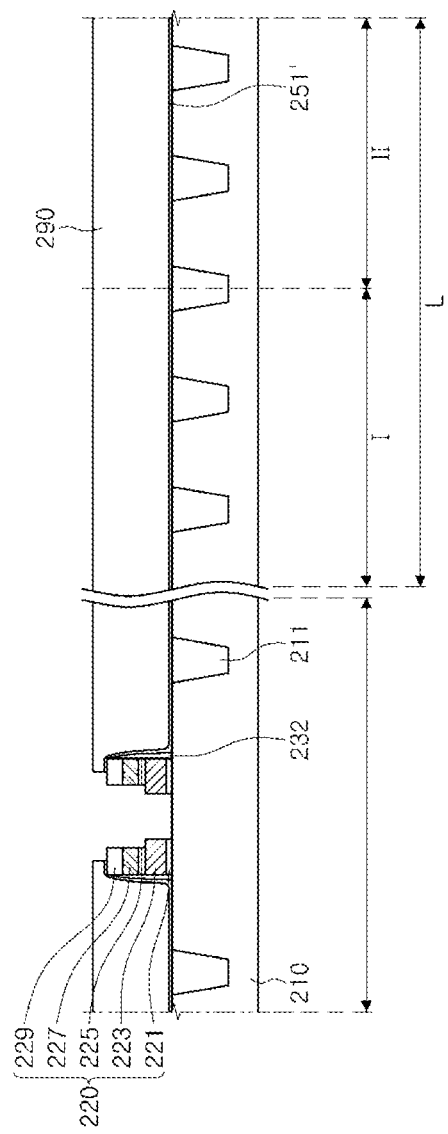

Referring to FIG. 21, a first high-voltage gate insulating film 251' and a first photoresist pattern 290 may be formed in such a manner that a space between the split gate structures 220 may be exposed. The space between the split gate structures 220 exposed by the first photoresist pattern 290 may be selectively etched, whereby the first high-voltage gate insulating film 251', the first spacer 231, and the split gate spacer 232 formed between the split gate structures 220 may be removed. Thus, an upper surface of the substrate 210 may be exposed from a space between the split gate structures 220.

Figure 22:
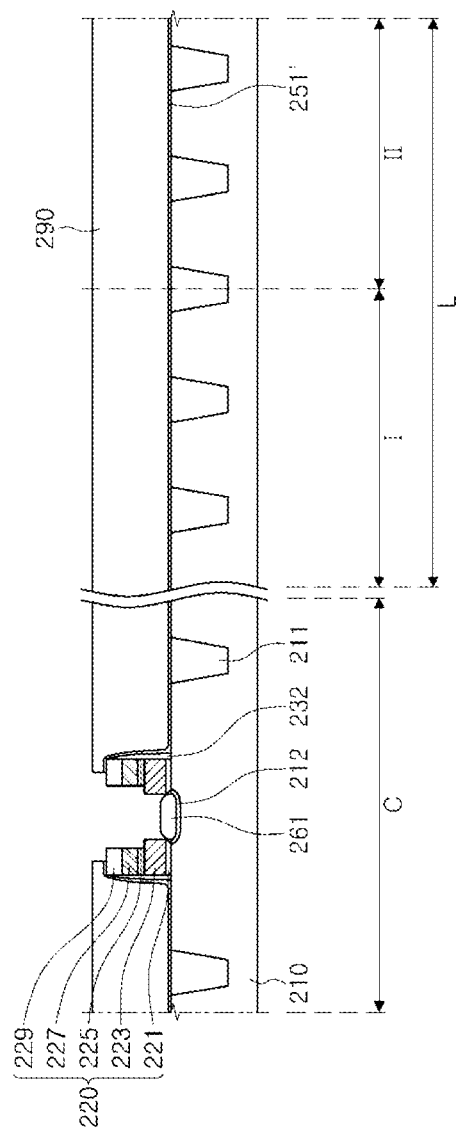

Then, referring to FIG. 22, a first impurity region 212 may be formed by injecting an impurity into the space between the split gate structures 220. The impurity injected into the first impurity region 212 may be an n-type impurity or a p-type impurity, and the first impurity region 212 may be provided as a source region. An oxide layer 261 may be formed on the first impurity region 212 by oxidizing a partial region of the substrate 210.

Figure 23:
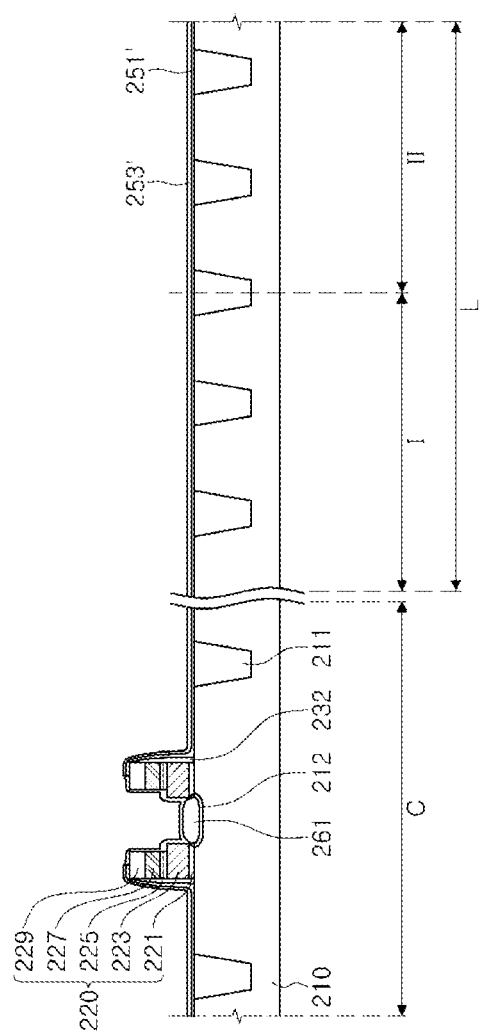

Referring to FIG. 23, the first photoresist pattern 290 may be removed, and a second high-voltage gate insulating film 253' may be formed on the first high-voltage gate insulating film 251' and the substrate 210. Therefore, the first and second high-voltage gate insulating film 251' and 253' may be sequentially stacked on the substrate 210. Both of the first high-voltage gate insulating film 251' and the second high-voltage gate insulating film 253' may contain a silicon oxide and may be used for forming a gate insulating layer of a first circuit element formed in a first region I.

Figure 24:
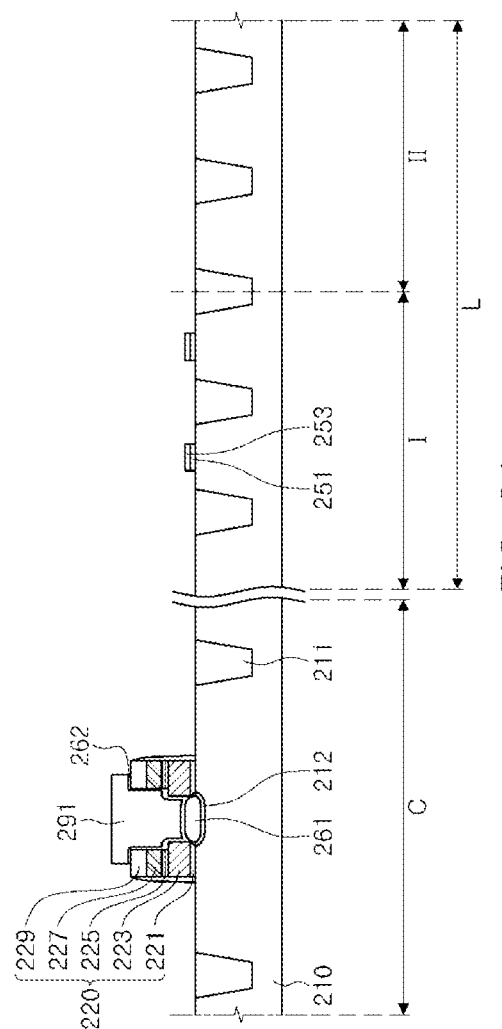

Referring to FIG. 24, a second photoresist pattern 291 may be formed in the space between the split gate structures 220 and the first and second high-voltage gate insulating films 251' and 253' may be selectively removed. A residue of the second high-voltage gate insulating film 253' remaining in the space between the split gate structures 220, that is, between the split gate structures 220 and the second photoresist pattern 291 may be provided as a first erase gate insulating layer 262. Residues of the first and second high-voltage gate insulating films 251' and 253' remaining in the first region I of the logic region L may be provided as first and second high-voltage gate insulating layers 251 and 253.

Figure 25:
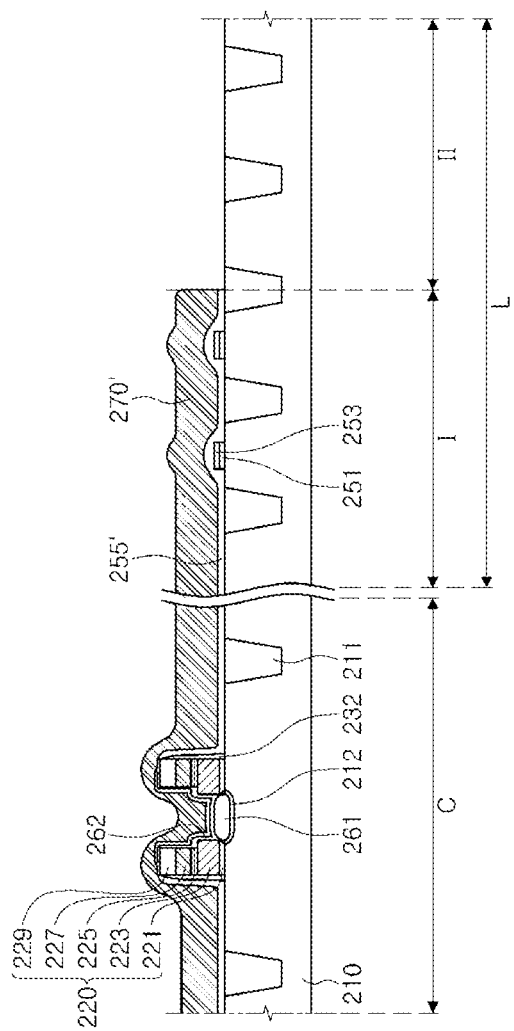

Referring to FIG. 25, after removing the second photoresist pattern 291, a third high-voltage gate insulating film 255' and a first gate electrode film 270' may be formed on the substrate 210. After forming the third high-voltage gate insulating film 255' and the first gate electrode film 270' over the entirety of the cell region C and the logic region L, that is, on the overall surface of the substrate 210, they may be selectively removed in a second region II of the logic region L. Otherwise, a mask layer covering the second region II of the logic region L may be first prepared, whereby the third high-voltage gate insulating film 255' and the first gate electrode film 270' may only be formed in the cell region C and the first region I of the logic region L.

Figure 26:
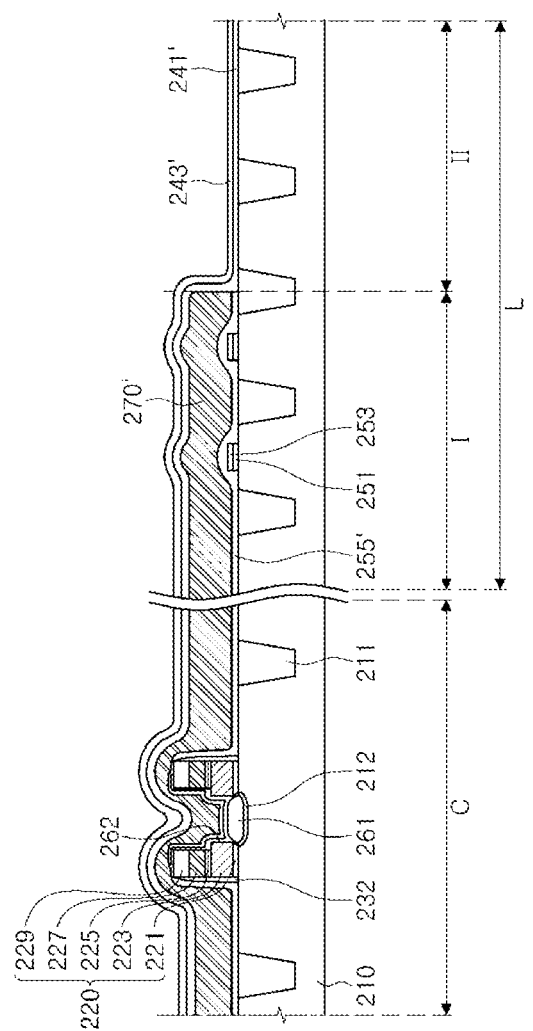
Figure 27:
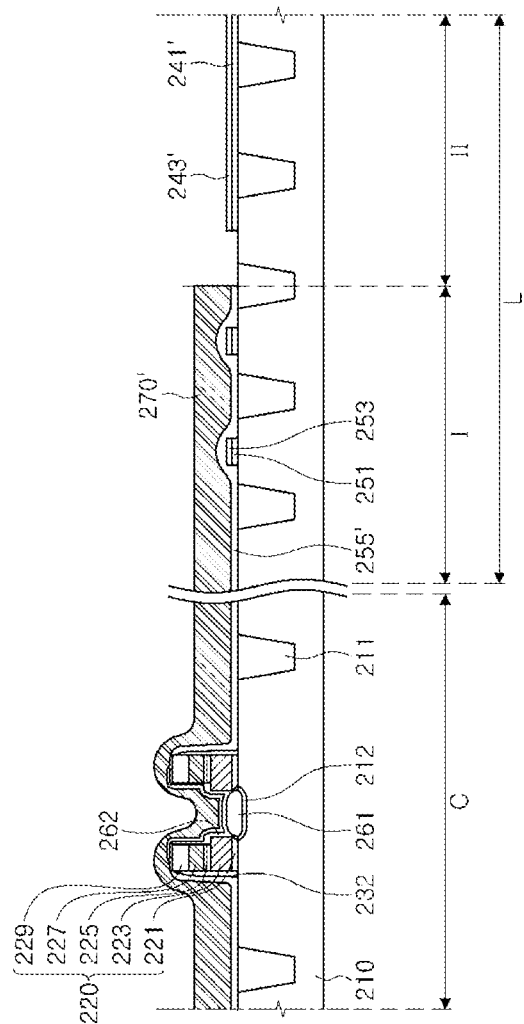

Referring to FIG. 26, a first gate insulating film 241' and a metal gate film 243' may be formed on the first gate electrode film 270'. The first gate insulating film 241' may be formed of a material having a higher dielectric constant than that of a silicon oxide, and the metal gate film 243' may contain a metal or a metallic nitride. Then, referring to FIG. 27, portions of the first gate insulating film 241' and the metal gate film 243' formed in regions except for the second region II of the logic region L, that is, formed in the cell region C and the first region I, may be removed.

Figure 28:
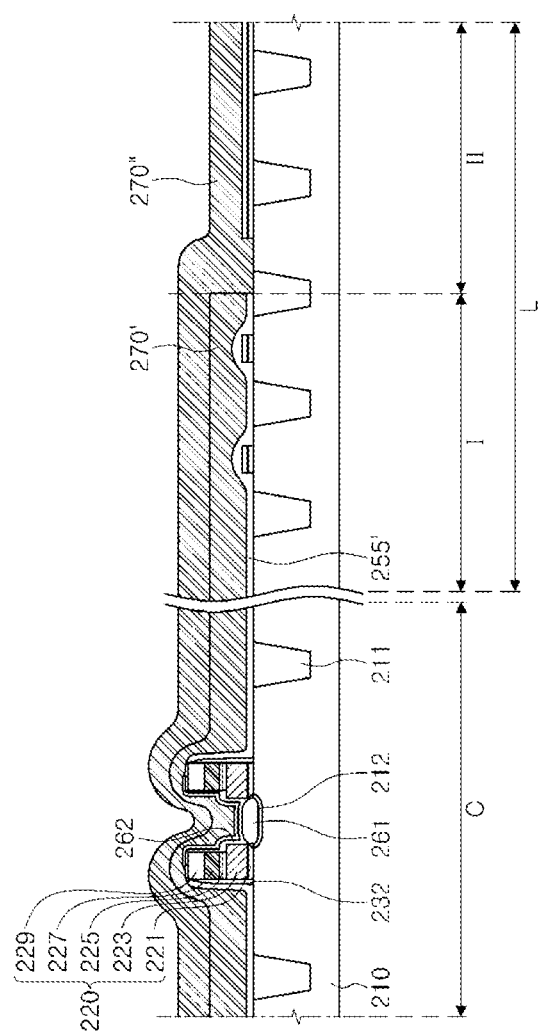

Referring to FIG. 28, a second gate electrode film 270" may be formed on the first gate electrode film 270' and the metal gate film 243'. The second gate electrode film 270" may contain doped polysilicon or the like, similarly to the case of the first gate electrode film 270' and may be formed over the cell region C and the logic region L. When the second gate electrode film 270" is formed, the first and second gate electrode films 270' and 270" and the third high-voltage gate insulating film 255', the metal gate film 243' and the first gate insulating film 241' may be selectively removed, whereby a memory cell element 200, a first circuit element 250, and a second circuit element 240 may be formed.

Figure 29:
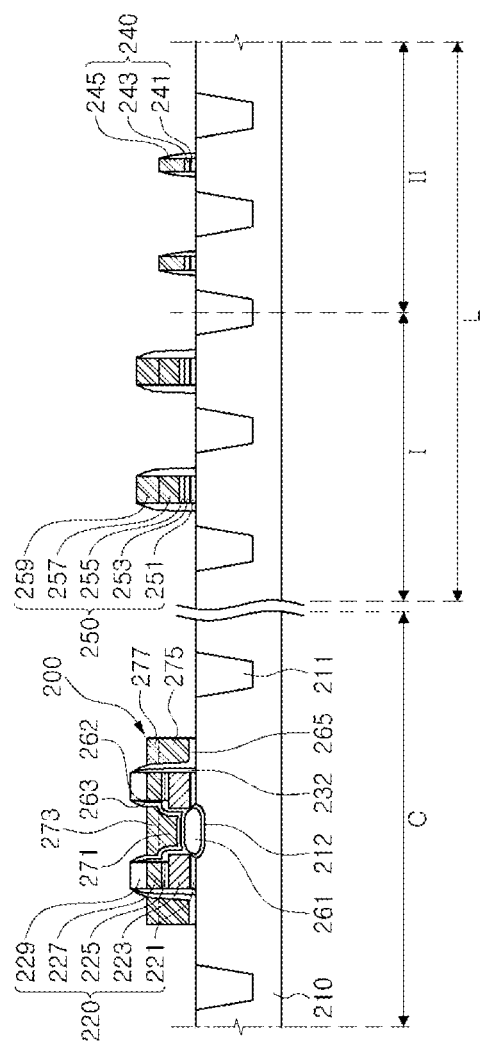

Referring to FIG. 29, the erase gate electrode layers 271 and 272, the select gate electrode layers 273 and 274, and high-voltage gate electrode layers 257 and 259 of the first circuit device 250 may be provided by retaining portions of the first and second gate electrode films 270' and 270". Thus, a logic gate electrode layer 245 of the second circuit device 240 may be thinner than the erase gate electrode layers 271 and 272, the select gate electrode layers 273 and 274, and the high-voltage gate electrode layers 257 and 259.

First and second erase gate insulating layers 262 and 263 may be disposed between the erase gate electrode layers 271 and 272 and the oxide layer 261 of the substrate 210. In addition, a select gate insulating layer 265 may be disposed between the select gate electrode layers 273 and 274 and the substrate 210.

Figure 30:
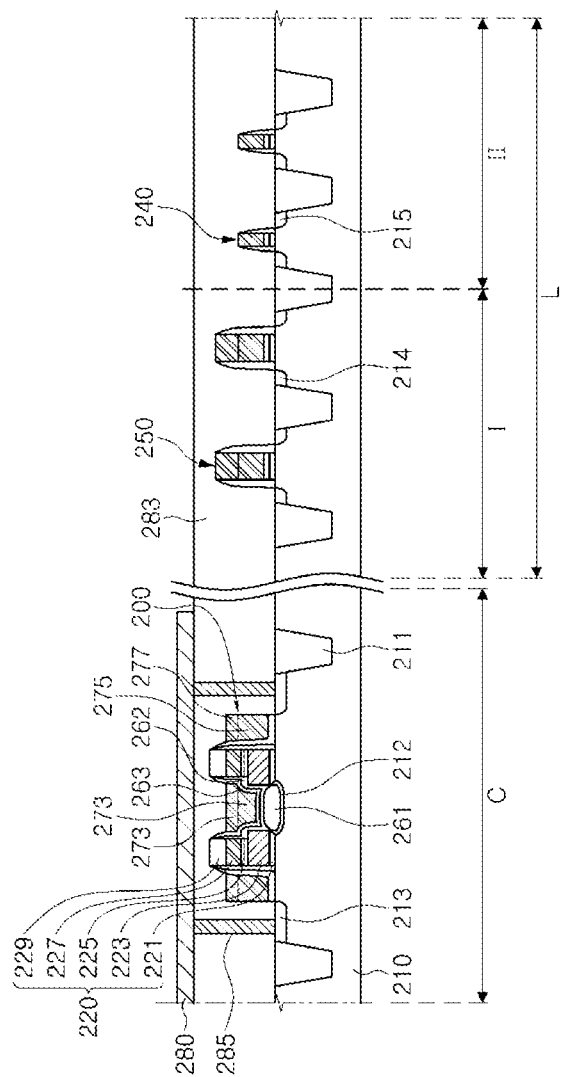

Referring to FIG. 30, an interlayer insulating layer 283 may be formed on the substrate 210, and a bit line 280 may be provided on the interlayer insulating layer 283 and may be electrically connected to a second impurity region 213 adjacent to the memory cell device 200 through a bit line contact portion 285. The bit line 280 and the bit line contact portion 285 may contain at least one of a metal, a metallic nitride and doped polysilicon, and the interlayer insulating layer 283 may contain a silicon oxide.

According to example embodiments described with reference to FIG. 20 through FIG. 30, the second circuit element 240 may include a metal gate layer 243 unlike the memory cell element 200 and the first circuit element 250. The semiconductor device is not limited to having such a form and the first circuit element 250 may also include the metal gate layer 243.

FIG. 31 through FIG. 34 are views illustrating a method of manufacturing a semiconductor device according to example embodiments.

Figure 31:
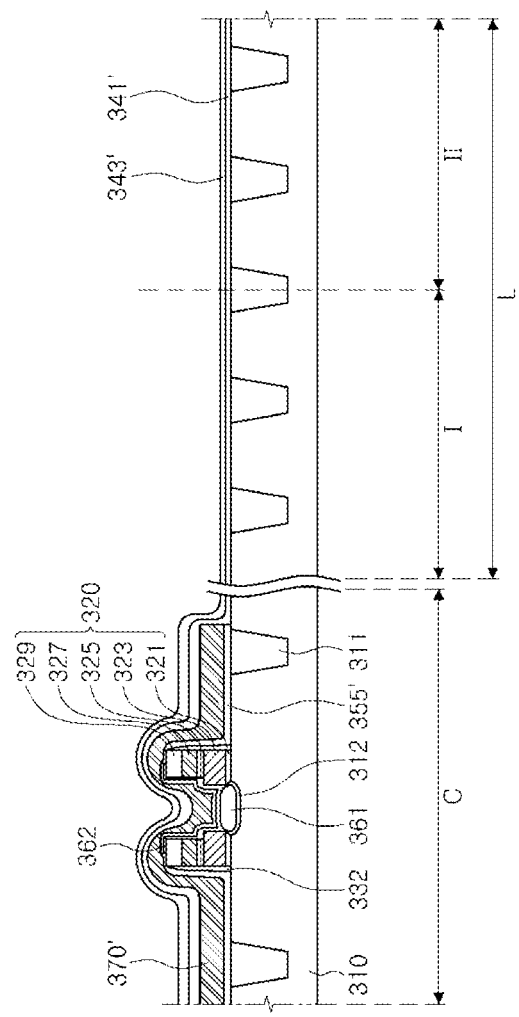
FIG. 31 through FIG. 34 illustrate a method of manufacturing a semiconductor device according to at least one example embodiment.

Referring to FIG. 31, element separation layers 311 may be formed on a substrate 310. Here, split gate structures 320, a first impurity region 312 and an oxide layer 361 provided in a space between the split gate structures 320, a first erase gate insulating layer 363, a split gate spacer 332 provided on the outside of each of the split gate structures 320, and the like may be disposed on an upper surface of the substrate 310. In a cell region C, a second erase gate insulating layer and a select gate insulating film 355' for forming a select gate insulating layer may be formed.

A first gate electrode film 370' may be formed on the select gate insulating film 355'. The first gate electrode film 370' and the select gate insulating film 355' may only be formed in the cell region C. A first gate insulating film 341' and a metal gate film 343' may be sequentially formed on an upper surface of the first gate electrode film 370' and the substrate 310 of the logic region L.

Figure 32:
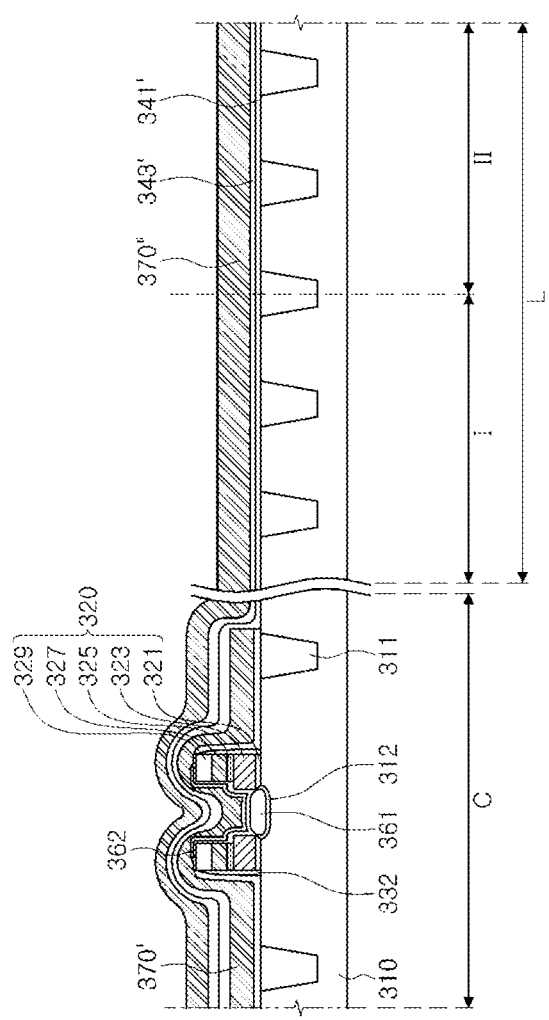

Next, referring to FIG. 32, a second gate electrode film 370" may be formed on the metal gate film 343'. The second gate electrode film 370" may contain doped polysilicon, similarly to the case of the first gate electrode film 370'. When the second gate electrode film 370" is formed, the first and second gate electrode films 370' and 370", the metal gate film 343', the first gate insulating film 341', the select gate insulating film 355', and the like may be selectively removed, whereby an erase gate electrode 371, a select gate electrode 373, a first circuit device 350, a second circuit device 340 and the like may be formed.

Referring to FIG. 32, the second gate electrode film 370" present within the cell region C may be entirely removed in such a manner that the metal gate film 343' and the first gate insulating film 341' do not remain within the cell region C. Even in the case that the second gate electrode film 370" partially remains within the cell region C due to an error in a process, since it is intended not to remain the second gate electrode film 370", the example embodiments of FIG. 31 through FIG. 34 may be different from the foregoing example embodiments described with reference to FIG. 20 through FIG. 30.

Figure 33:
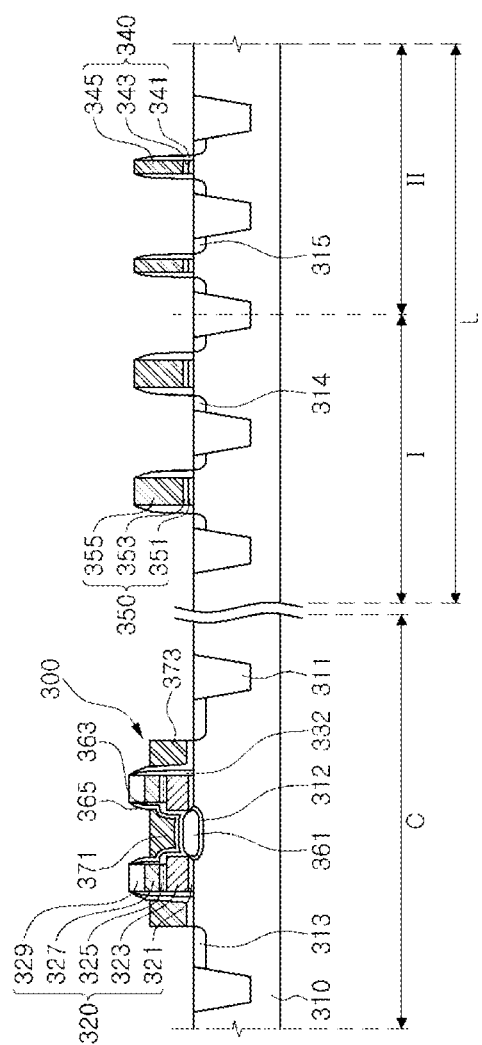

Referring to FIG. 33, the erase gate electrode 371 may be formed between the split gate structures 320, and the select gate electrode 373 and a select gate insulating layer 365 may be formed on outer side surfaces of each split gate structure 320. The first circuit element 350 may be formed in a first region I of the logic region L and the second circuit element 340 may be formed in a second region II of the logic region L. The first circuit element 350 may be operated by receiving a voltage relatively higher than that of the second circuit element 340.

Comparing the example embodiment of FIG. 29 with the example embodiment of FIG. 33, in the example embodiment of FIG. 33, the erase gate electrode 371 and the select gate electrode 373, a high-voltage gate electrode 355, and a low-voltage gate electrode 345 may be formed from the first gate electrode film 370'. That is, the second gate electrode film 370" may be intentionally removed and may not remain in a manufacturing process. Accordingly, the gate electrodes 355 and 345 of the first and second circuit element 350 and 340 may have the same thickness.

Figure 34:
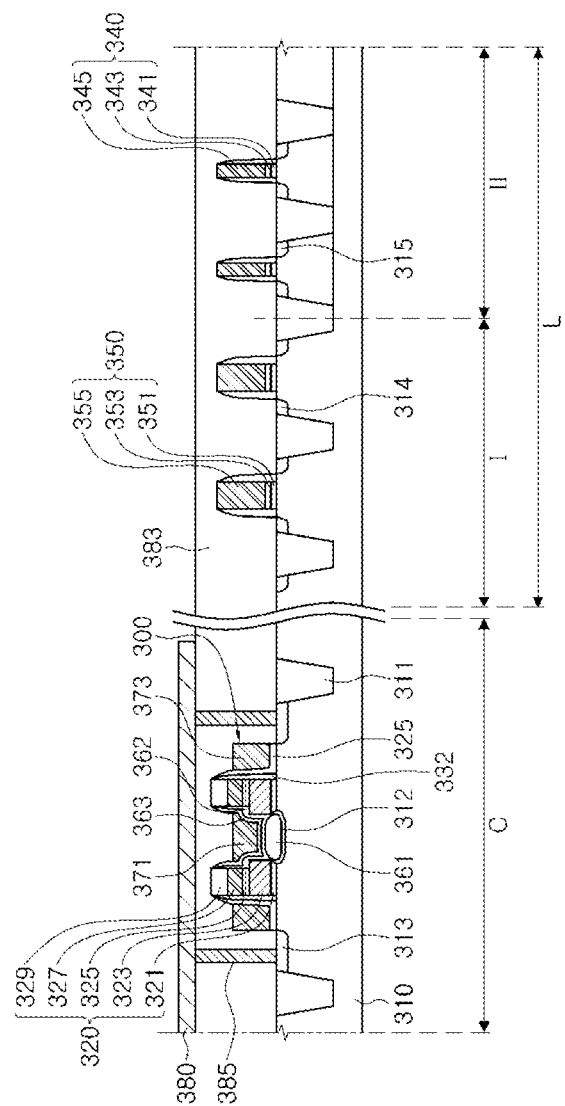

Referring to FIG. 34, an interlayer insulating layer 383 may be formed on the substrate 310, and a bit line 380 may be provided on the interlayer insulating layer 383 and may be electrically connected to a second impurity region 313 adjacent to a memory cell element 300 through a bit line contact portion 385. The bit line 380 and the bit line contact portion 385 may contain at least one of a metal, a metallic nitride and doped polysilicon.

In at least one example embodiment, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In at least one example embodiment, the 3D memory array includes vertical NAND strings that are vertically oriented such that at least one memory cell is located over another memory cell. The at least one memory cell may comprise a charge trap layer.

The following patent documents, the entire contents of which are incorporated herein by reference, describe configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As set forth above, according to example embodiments, at least a portion of a first circuit device and a second circuit device included in a logic region may have a structure in which a high-k layer and a metal gate layer are sequentially stacked, and at least a portion of a memory cell device may not include the metal gate layer. Thus, a gate leakage phenomenon may be efficiently prevented or lessened and at the same time, an electrical short phenomenon that may be caused by the metal gate layer in the memory cell device and a data retention error may be prevented or lessened.

While example embodiments have been shown and described above, it will be apparent to those skilled in the art that modifications and variations could be made without departing from the scope of the invention as defined by the appended claims.

What is claimed is:

1. A method of manufacturing a semiconductor device, the method comprising:
   forming split gate structures, each including a floating gate electrode layer and a control gate electrode layer in a cell region of a substrate, the substrate including the cell region and a logic region adjacent to the cell region;
   sequentially forming a first gate insulating film and a metal gate film in the logic region and the cell region;
   removing the metal gate film from at least a portion of the cell region and the logic region;
   forming a second gate insulating film on the first gate insulating film from which the metal gate film has been removed;
   forming a gate electrode film on the logic region and the cell region; and
   forming a plurality of memory cell elements disposed in the cell region and a plurality of circuit elements disposed in the logic region by patterning the first and second gate insulating films, the gate electrode film, and a residue of the metal gate film.

2. The method of claim 1, wherein the logic region includes a first region adjacent to the cell region and a second region adjacent to the first region.

3. The method of claim 2, wherein the removing removes the metal gate film in the first region and the at least a portion of the cell region, while the metal gate film remains in the second region.

4. The method of claim 3, wherein a gate electrode formed in the first region and a gate electrode formed in the second region have different widths.

5. The method of claim 2, wherein the removing removes the metal gate film in the at least a portion of the cell region, while the metal gate film remains in the first region and the second region.

6. The method of claim 1, wherein the forming a plurality of gate electrodes includes:
   forming an erase gate electrode between the split gate structures; and
   forming a select gate electrode on an outside of each of the split gate structures.

7. The method of claim 1, wherein the removing comprises:
   performing a wet-etching process in which the metal gate film is removed in at least a portion of the logic region and the cell region, the wet-etch process using an etching solution containing an SC1 solution.

8. The method of claim 1, wherein the removing removes a portion of the metal gate film enclosing one end of the control gate electrode layer in an edge of the cell region.

9. The method of claim 1, wherein the first gate insulating film contains at least one of an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$).

10. A method of manufacturing a semiconductor device having a split gate structure, the method comprising:
    forming a split gate structure on a substrate, the substrate including a cell region and a logic region;
    sequentially forming a first gate insulating film and a metal gate film on the split gate structures;
    removing a portion of the metal gate film;
    forming a second gate insulating film on the first gate insulating film;
    forming a gate electrode film on the cell region and the logic region; and
    forming an insulating layer, a first circuit element, a second circuit element, and a bit line on the substrate.

11. The method of claim 10, further comprising:
    injecting an impurity in a partial region of the substrate between the split gate structures to form a first impurity region.

12. The method of claim 11, further comprising:
    oxidizing the partial region of the substrate to form an oxide layer on the first impurity region.

13. The method of claim 12, wherein the oxide layer includes a central portion that is bulged.

14. The method of claim 10, wherein the removing a portion of the metal gate film completely removes the metal gate film in the cell region.

15. The method of claim 10, wherein the forming a split gate structure comprises:
    forming a floating gate electrode and a control gate electrode in the cell region of the substrate.

* * * * *